(12) United States Patent
Kwon (10) Patent No.: US 7,772,884 B2
(45) Date of Patent: Aug. 10, 2010

(54) CAPACITIVE COUPLING TYPE LEVEL SHIFT CIRCUIT OF LOW POWER CONSUMPTION AND SMALL SIZE

(75) Inventor: Oh-Kyong Kwon, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 41 days.

(21) Appl. No.: 12/223,966

(22) PCT Filed: Jan. 22, 2007

(86) PCT No.: PCT/KR2007/000358

§ 371 (c)(1),
(2), (4) Date: Dec. 9, 2008

(87) PCT Pub. No.: WO2007/094571

PCT Pub. Date: Aug. 23, 2007

(65) Prior Publication Data

US 2009/0219074 A1 Sep. 3, 2009

(30) Foreign Application Priority Data

Feb. 14, 2006 (KR) .................. 10-2006-0013963

(51) Int. Cl.
*H03K 19/094* (2006.01)
*H03K 19/096* (2006.01)

(52) U.S. Cl. .................. 326/68; 326/95; 327/333

(58) Field of Classification Search .............. 326/63, 326/68, 95, 98; 327/333
See application file for complete search history.

(56) References Cited

U.S. PATENT DOCUMENTS

| 6,208,200 | B1 | 3/2001 | Arakawa |
| 7,554,378 | B2 * | 6/2009 | Walker ............ 327/322 |
| 2005/0156844 | A1 | 7/2005 | Kanbara et al. |

FOREIGN PATENT DOCUMENTS

KR 10-2000-0020964 4/2000

OTHER PUBLICATIONS

International Search Report dated May 4, 2007.
S.C. Tan et al.: "Low Power CMOS Level Shifters by Bootstrapping Technique", Electronics Letters, Aug. 1, 2002, vol. 38, No. 16, Mar. 27, 2002.

* cited by examiner

*Primary Examiner*—Daniel D Chang
(74) *Attorney, Agent, or Firm*—Harness, Dickey & Pierce, P.L.C.

(57) ABSTRACT

Provided is a level shift circuit. The level shift circuit includes an inverter including a first transistor having a first polarity to which an input signal from an input port is applied through a gate and a second transistor having a second polarity which is an opposite polarity to the first polarity, the second transistor being connected in series to the first transistor between a positive source voltage and a negative source voltage and a connection node between the first and second transistors being an output port, a capacitor connected between a gate of the first transistor and a gate of the second transistor, and a voltage adjusting means for accurately adjusting a voltage applied to the gate of the second transistor according to an exact switching operation time of the second transistor, using a clock signal and an output port signal of the inverter. A stable and high-speed operation can be performed with a comparatively small size and low power consumption can be achieved.

7 Claims, 7 Drawing Sheets

FIG.8

CAPACITIVE COUPLING TYPE LEVEL SHIFT CIRCUIT OF LOW POWER CONSUMPTION AND SMALL SIZE

TECHNICAL FIELD

The present invention relates to a level shift circuit, and more particularly, to a level shift circuit which is appropriate to a device for driving a flat display in which comparatively small size, excellent operating stability, high-speed operation and low power consumption are achieved.

BACKGROUND ART

Generally, when two circuits having different sizes of signal voltages are connected to each other, a level shift circuit is positioned between the circuits and changes the sizes of signal voltages. Such a level shift circuit is mainly used when the sizes of signal voltages are changed from a smaller voltage range to a larger voltage range.

In particular, in a circuit for driving a flat display device, such as a liquid crystal display (LCD), a plasma display panel (PDP), a field emission display (FED) or an electro-luminescent display (ELD), a digital circuit portion is designed to operate with a low voltage for low power consumption, and due to the characteristic of a panel for driving a element, such as a liquid crystal (LC) or organic light emitting diode (OLED), a level shift circuit is used to convert a signal in the digital circuit portion to be appropriate to the range of a voltage for driving the panel.

Figure 1:
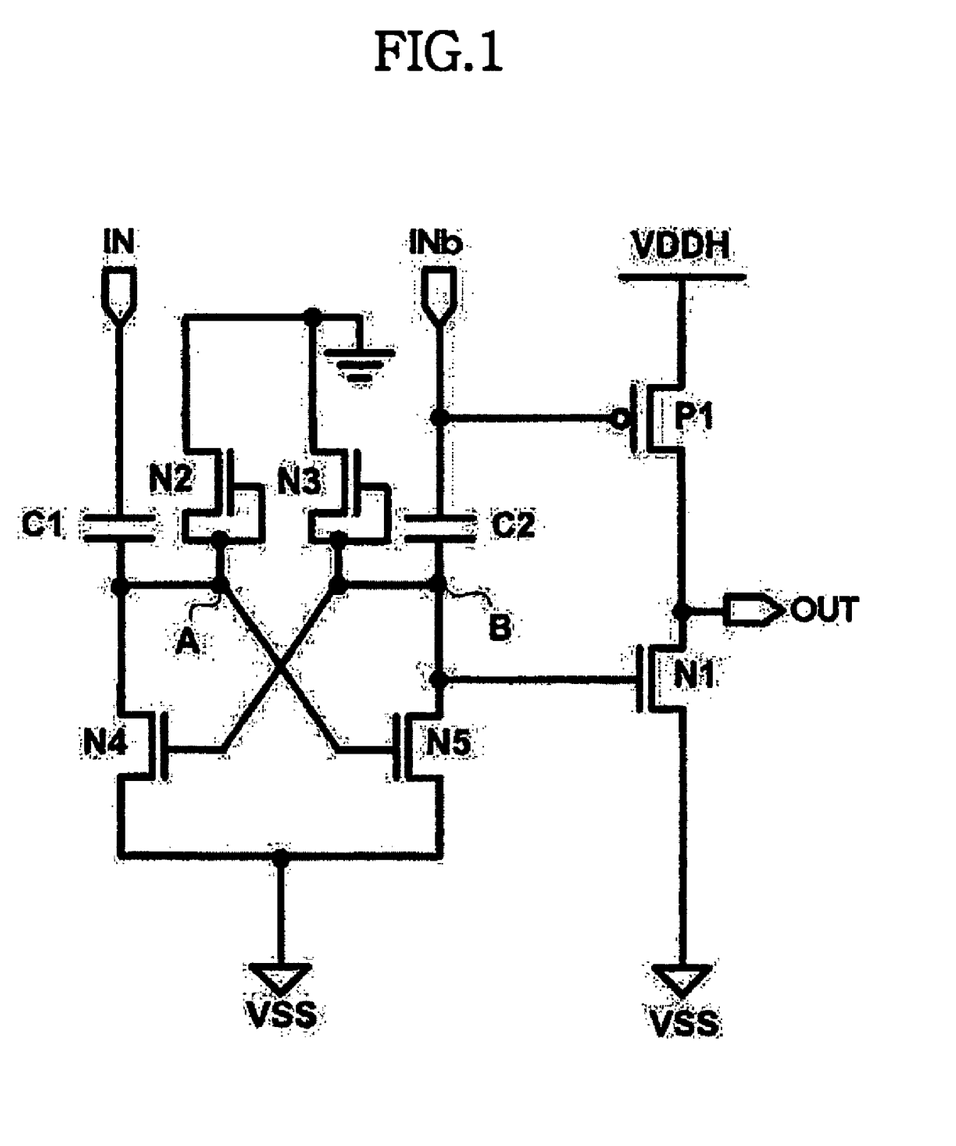
FIG. 1 illustrates an example of a conventional capacitive coupling type level shift circuit.

An example of a conventional capacitive coupling type level shift circuit is illustrated in FIG. 1 (S. C. Tan, et al., Low Power CMOS Level Shifters by Bootstrapping Technique, Electronics letters, August 2002, Vol. 38, No. 16).

As illustrated in FIG. 1, in the level shift circuit, two N-type transistors N4 and N5 and two diode-coupled N-type transistors N2 and N3, and two capacitors C1 and C2 are connected to an input port, and a P-type transistor P1 and an N-type transistor N1 are connected to an output port.

Figure 2:
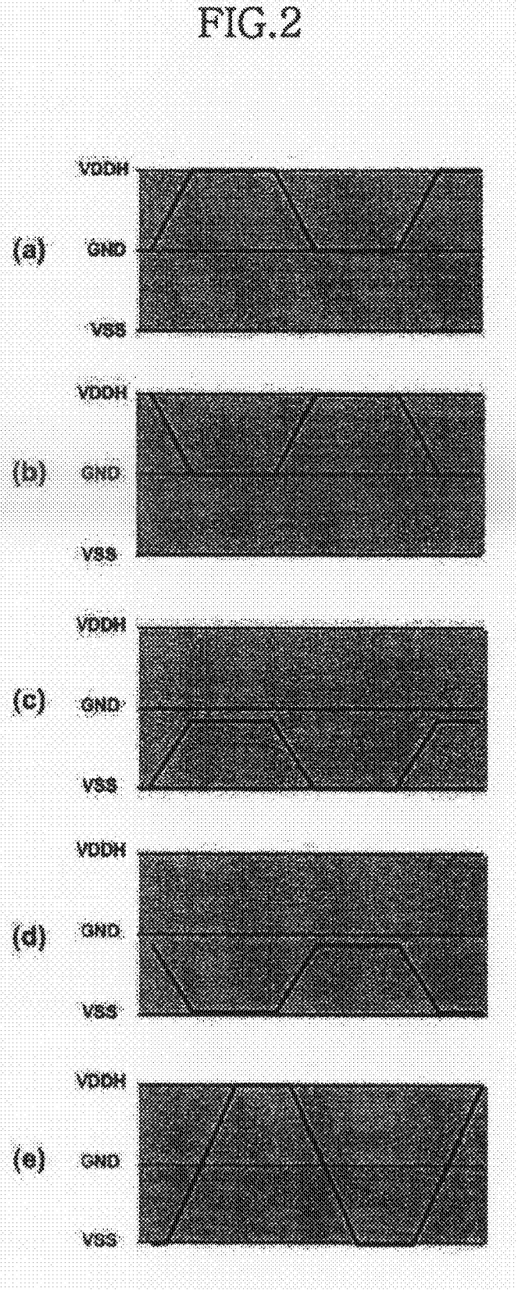
FIG. 2 is a schematic signal characteristic diagram of important parts of the level shift circuit illustrated in FIG. 1.

In the level shift circuit using capacitive coupling having the above structure, as an input signal IN shown in (a) of FIG. 2 and an inverted input signal INb shown in (b) of FIG. 2 are input to the input port, a voltage at a node A is as shown in (c) of FIG. 2 by the capacitor C1 and the diode-coupled N-type transistor N2, and a voltage at a node B is as shown in (d) of FIG. 2 by the capacitor C2 and the diode-coupled N-type transistor N3. An output voltage signal OUT at the output port is level shifted, as shown in (e) of FIG. 2, according to voltage signals at the nodes A and B and a voltage signal of the inverted input signal INb. That is, the input signal IN having an operating range of GND~VDDH is level shifted into the output signal OUT having an operating range of VSS~VDDH.

The level shift circuit using capacitive coupling has low power consumption. On the other hand, since two capacitors which take a larger area than the area of a transistor are used, the left shift circuit has a large size. In addition, a feedback operation is performed so as to disturb a normal operation at the nodes A and B that are capacitive-coupled when the input signal IN is transited, and there is the possibility of the occurrence of an unstable operation. Thus, the conventional level shift circuit is not suitable for use in a circuit for driving a flat display.

Figure 3:
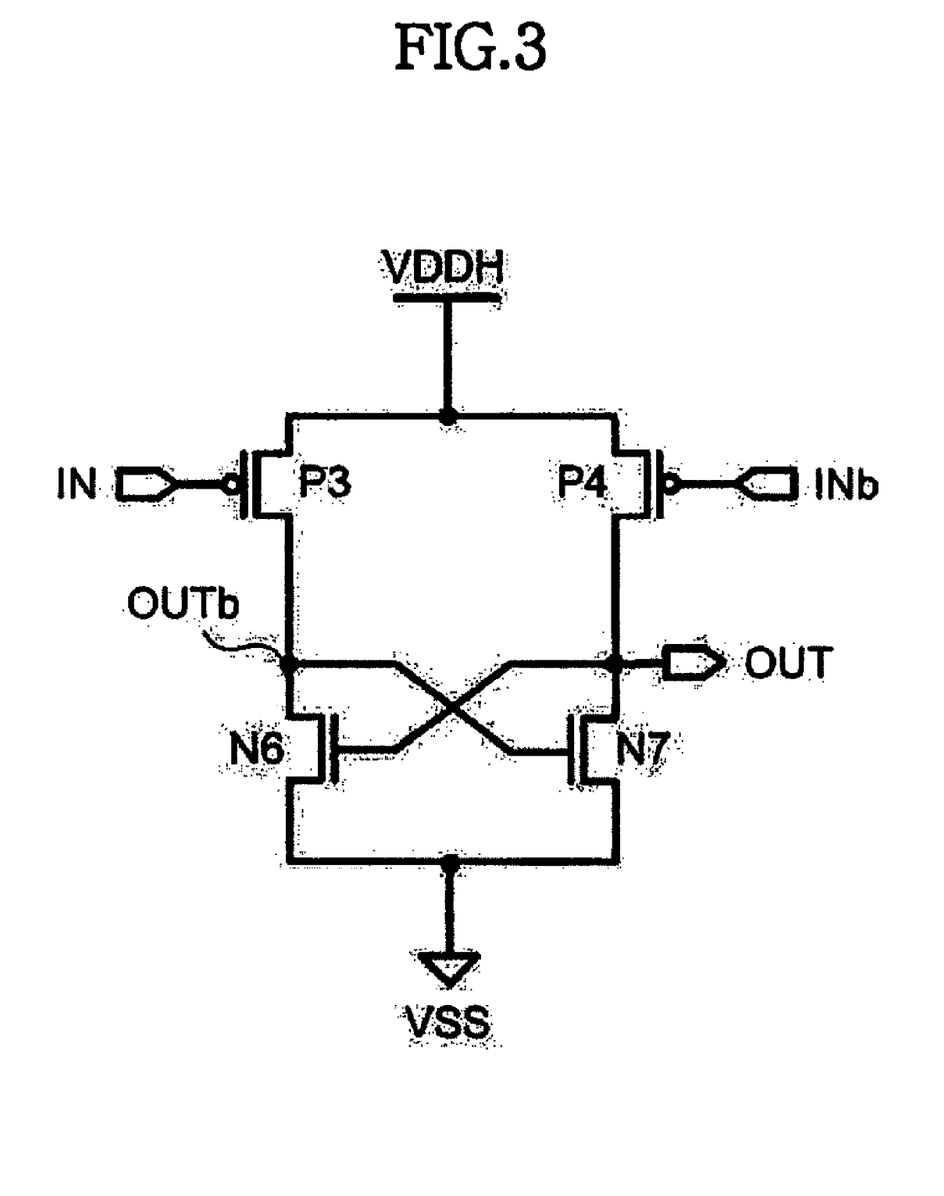
FIG. 3 illustrates an example of a conventional latch-type level shift circuit.

As another example of a conventional level shift circuit, a latch-type level shift circuit generally used in a circuit for driving a flat display is shown in FIG. 3. As illustrated in FIG. 3, the level shift circuit includes two P-type transistors P3 and P4 and two N-type transistors N6 and N7.

An input signal IN is input to a gate of the P-type transistor P3, an inverted input signal INb is input to a gate of the P-type transistor P4, and drains of the P-type transistors P3 and P4 are connected to a positive first source voltage VDDH. A drain of the N-type transistor N6 is connected to a source of the P-type transistor P3, a gate of the N-type transistor N6 is connected to a drain of the P-type transistor P4, a drain of the N-type transistor N7 is connected to the source of the P-type transistor P4, a gate of the N-type transistor N7 is connected to the source of the P-type transistor P3, and sources of the N-type transistors N6 and N7 are connected to a negative second source voltage VSS. The level shift circuit constructed in this way and shown in FIG. 3 has a cross-coupled latch structure.

Figure 4:
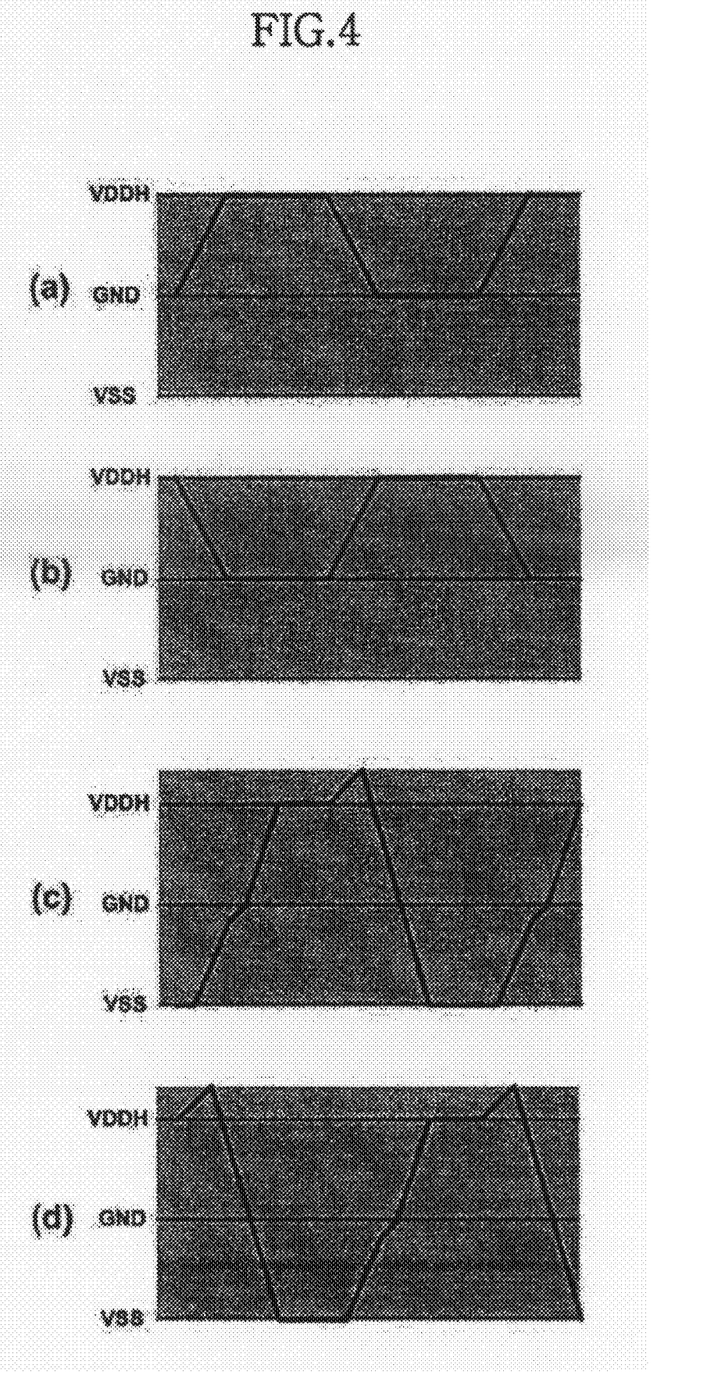
FIG. 4 is a schematic signal characteristic diagram of important parts of the level shift circuit illustrated in FIG. 3.

In the level shift circuit having the cross-coupled latch structure, as an input signal IN shown in (a) of FIG. 4 and an inverted input signal INb shown in (b) of FIG. 4 are input to gates of the P-type transistors P3 and P4, respectively, an output signal OUT at an output port is level shifted, as shown in (c) of FIG. 4, and an inverted output signal OUTb which is inverted from the output signal OUT, is formed at a connection node between the P-type transistor P3 and the N-type transistor N6, that is, a gate terminal of the N-type transistor N7, as shown in (d) of FIG. 4. That is, the input signal IN having an operating range of GND~VDDH is level shifted into the output signal OUT having an operating range of VSS~VDDH.

The operation of the level shift circuit having the cross-coupled latch structure will now be described in detail. In other words, when the input signal IN is changed from a ground voltage GND to the positive first source voltage VDDH, the P-type transistor P3 is turned off. At this time, the P-type transistor P4 driven by the inverted input signal INb is turned on and starts charging the output port to the positive first source voltage VDDH. However, in the state where the P-type transistor P4 is turned off and the output port is not sufficiently charged to the positive first source voltage VDDH, the N-type transistor N6 is weakly turned on. As such, it takes time to charge the inverted output signal node from the positive first source voltage VDDH to the negative second source voltage VSS. Accordingly, the N-type transistor N7 is not turned off by the inverted output signal OUTb so that a time period in which the P-type transistor P4 is turned on by the inverted input signal INb and simultaneously, the N-type transistor N7 is turned on by the inverted output signal OUTb is generated, a pass through current from the positive first source voltage VDDH to the negative second source voltage VSS is generated and power consumption increases accordingly.

Similarly, when the input signal IN is changed from the first source voltage VDDH into the ground voltage GND, the P-type transistor P4 connected to the inverted input port is turned off and the P-type transistor P3 is turned on so that the inverted output signal node is charged to the positive first source voltage VDDH. In this case, the N-type transistor N7 is weakly turned on by the inverted output signal OUTb and the first source voltage VDDH at the output port is not rapidly reduced to the voltage VSS. As a result, the N-type transistor N6 is turned on and generates a pass through current from VDDH to VSS together with the P-type transistor P3 turned on by the input signal IN, and power consumption increases accordingly.

In particular, the above-mentioned problem about large power consumption is associated with a structural disadvantage that, due to the characteristic of a latch structure, speed at which a change of the input signal IN and the inverted input signal INb affects the output signal OUT and the inverted output signal OUTb is very slow, and there is a serious problem about an operating speed, together with the problem about power consumption.

In addition, the number of elements of a main body of a level shift circuit having a latch structure is very small (only 4) on the assumption that the generated inverted input signal INb is used. However, in case of the transistors P3 and P4 connected to the input signal IN and the inverted input signal INb, respectively, the input signal IN and the inverted input signal INb are transmitted to the output port in such a way that voltages of the input signal IN and the inverted input signal INb are changed into currents due to a transconductance characteristic. Thus, the sizes of the transistors P3 and P4 are increased so as to improve a transmission capability and thus, the advantage of area that only four transistors are used may be ambiguous.

In other words, the level shift circuit having the cross-coupled latch structure has very excellent operating stability and thus operates regardless of an initial voltage at each node. However, the level shift circuit has a disadvantage that the amount of a pass through current caused by a short circuit current generated as the N-type transistor and the P-type transistor are simultaneously turned on is large, an operating speed is slow and power consumption is large. Furthermore, the sizes of the transistors P3 and P4 should be increased so as to improve characteristics, and thus the level shift circuit has a disadvantage that the advantage of small size may be ambiguous.

DISCLOSURE OF THE INVENTION

The present invention provides a level shift circuit which is appropriate to a device for driving a flat display in which comparatively small size, stable and high-speed operation and low power consumption are achieved.

According to an aspect of the present invention, there is provided a level shift circuit, the level shift circuit including: an inverter including a first transistor having a first polarity to which an input signal from an input port is applied through a gate and a second transistor having a second polarity which is an opposite polarity to the first polarity, the second transistor being connected in series to the first transistor between a positive source voltage and a negative source voltage and a connection node between the first and second transistors being an output port; a capacitor connected between a gate of the first transistor and a gate of the second transistor; and a voltage adjusting means for accurately adjusting a voltage applied to the gate of the second transistor according to an exact switching operation time of the second transistor, using a clock signal and an output port signal of the inverter.

The voltage adjusting means may adjust the voltage applied to the gate of the second transistor after the input signal is fallen and transited, as a predetermined voltage level.

The voltage adjusting means may include: a third transistor having a second polarity whose gate is connected to an output port of the inverter and whose source is connected to the negative source voltage; and a fourth transistor having a second polarity whose source is connected to a drain of the third transistor and whose drain is connected to a connection node between the capacitor and the second transistor, a clock signal applied to a gate of the fourth transistor, wherein the clock signal has a low level when the input signal is transited and the clock signal has a high level after the input signal is transited.

The first polarity may be P-type and the second polarity may be N-type, and the predetermined voltage level may be a level of the negative source voltage.

The level shift circuit may further include an initial voltage setting means connected to the gate of the second transistor for setting an initial voltage input to the gate of the second transistor during initial driving. The initial voltage setting means may be a diode-coupled transistor formed between the gate of the second transistor and a ground.

BEST MODE FOR CARRYING OUT THE INVENTION

Hereinafter, a capacitive coupling type level shift circuit of low power consumption and small size according to an exemplary embodiment of the present invention will be described with reference to the accompanying drawings in greater detail.

Figure 5:
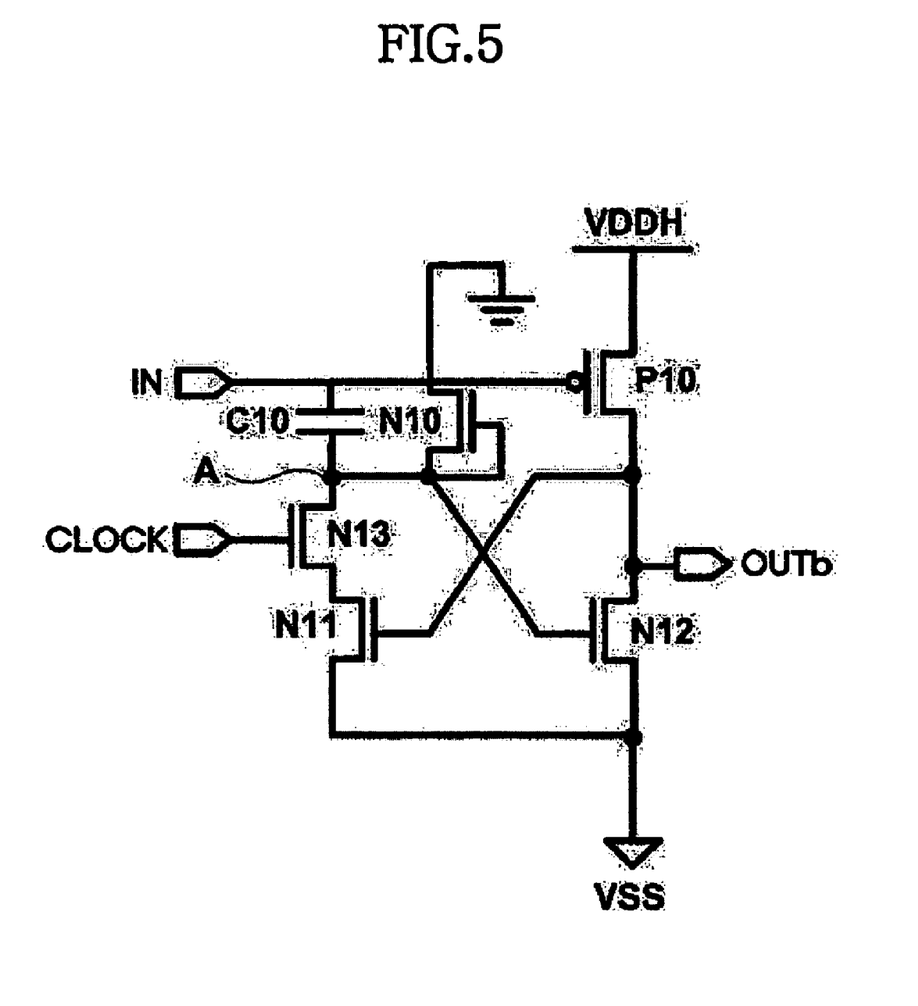
FIG. 5 illustrates a capacitive coupling type level shift circuit of low power consumption and small size according to an embodiment of the present invention.

The level shift circuit according to an exemplary embodiment of the present invention is illustrated in FIG. 5.

The level shift circuit illustrated in FIG. 5 can be applied to the case where a display unit and a circuit for driving the display unit are formed as a single body on a transparent insulating substrate. In this case, the level shift circuit may be formed on an insulating substrate as a thin film transistor (TFT) using low temperature poly-Si (LTPS).

The level shift circuit according to the exemplary embodiment of the present invention includes a P-type transistor P10, three N-type transistors N11~N13, a diode-coupled N-type transistor N10, and a capacitor C10.

An input voltage signal IN is input to a gate of the P-type transistor P10, a positive first source voltage VDDH (for example, 5V) is connected to a drain of the P-type transistor P10, a source of the P-type transistor P10 is connected to a drain of the N-type transistor N12, a negative second source voltage VSS (for example, −5V) is connected to a source of the N-type transistor N12, and a connection node between the transistors P10 and N12 is connected to an inverted output port OUTb.

In addition, a clock signal CLOCK is input to a gate of the N-type transistor N13, and the signal voltage input port OUTb, that is, the gate of the P-type transistor P10, is connected to a drain of the N-type transistor N13 via the capacitor C10. The inverted output port OUTb is connected to a gate of the N-type transistor N11, a source of the N-type transistor N13 is connected to a drain of the N-type transistor N11, and the negative second source voltage VSS is connected to a source of the N-type transistor N11.

In addition, a ground is connected to a source of the diode-coupled N-type transistor N10, and a common connection node A among one end of the capacitor C10, the drain of the N-type transistor N13 and the gate of the N-type transistor N12 is connected to a drain of the diode-coupled N-type transistor N10.

Here, the transistor N11 and the transistor N13 constitute a voltage adjusting means for accurately adjusting (re-defining) a voltage at a node A according to an exact switching operation time of the transistor N12. The diode-coupled N-type transistor N10 is constituted to set (define) an initial voltage at the node A.

The operation of the level shift circuit having the above structure according to the exemplary embodiment of the present invention will now be described.

When the level shift circuit of the present embodiment starts initial driving, the diode-coupled N-type transistor N10 defines a voltage, which is obtained by adding a threshold voltage Vth to a ground voltage GND, as an initial voltage at the node A.

First, when the input voltage signal IN is transited from GND to VDDH in the state where the node A is set at the initial voltage in this way, that is, during initial driving, the node A is capacitive-coupled and is continuously clamped to a voltage level (GND+Vth) by the diode-coupled N-type transistor N10. At this time, the P-type transistor P10 of an inverter is turned off, the N-type transistor N12 is turned on and the inverted output port is charged to VSS.

Figure 6:
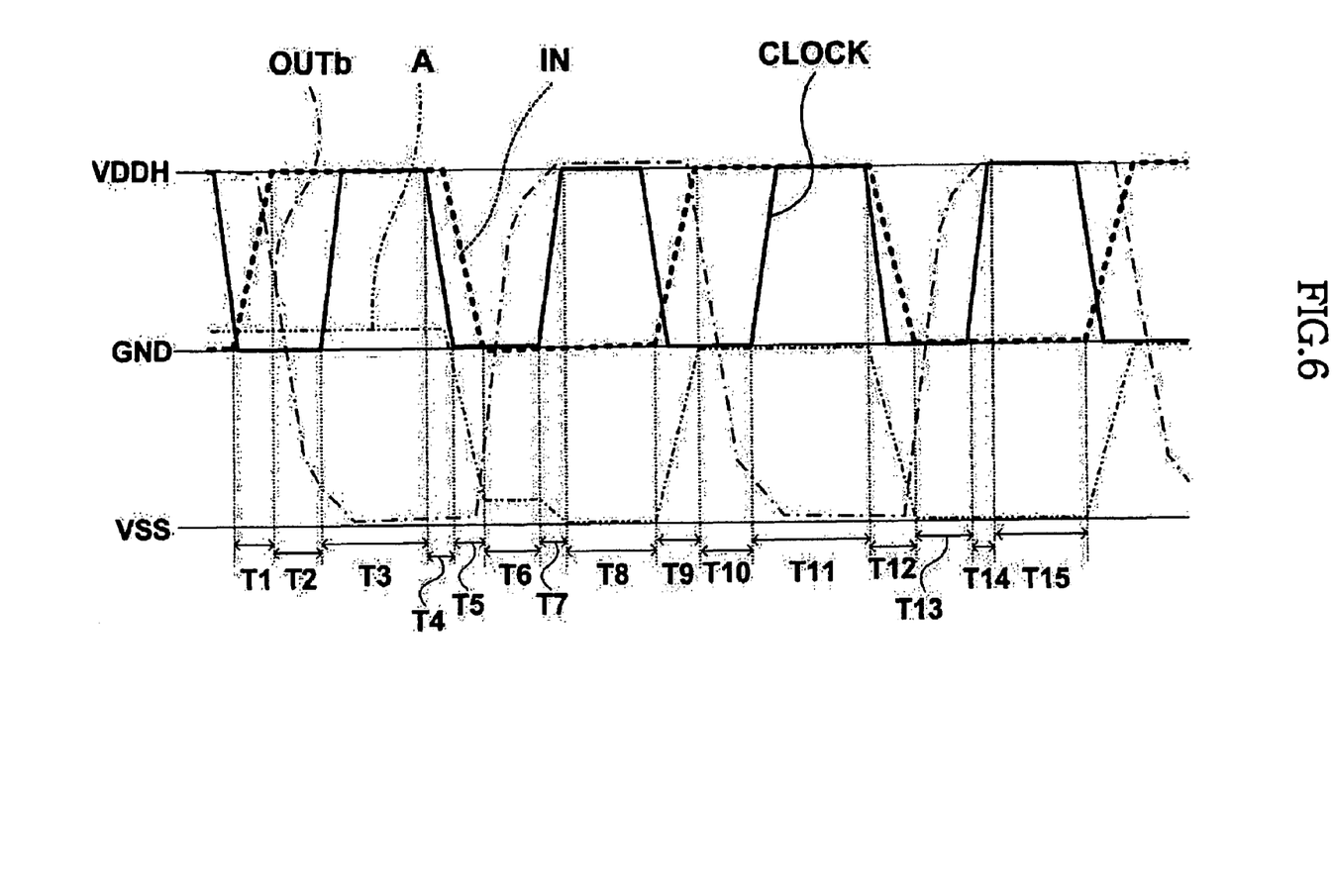
FIG. 6 is a signal characteristic diagram according to the operation of the level shift circuit illustrated in FIG. 5.

In this case, since the clock signal CLOCK at a low level is applied to the gate of the N-type transistor N13 when the input signal voltage IN is transited from GND to VDDH, the N-type transistor N13 is turned off (see time periods T1~T2 of FIG. 6). Thus, although, after the input voltage signal IN is transited from GND to VDDH, the inverted output port OUTb is completely charged to VSS, the node A is continuously maintained at the previous voltage (GND+Vth).

Subsequently, since the clock signal CLOCK is changed from a low level to a high level, the N-type transistor N13 is turned on and the inverted output port OUTb is maintained at VSS, the N-type transistor N11 is turned off and the node A is maintained at the previous voltage (GND+Vth) (see time period T3 of FIG. 6). Thereafter, the clock signal CLOCK is changed from the high level to the low level and the N-type transistor N13 is turned off (see time period T4 of FIG. 6).

Next, when the input voltage signal IN is transited from VDDH to GND (see time period T5 of FIG. 6), electric charges charged in the capacitor C10 are discharged and a voltage even at the node A is fallen by approximately VDDH and is transited to approximately (VSS+Vth). As such, the N-type transistor N12 is turned off, the P-type transistor P10 is turned on by the input voltage signal IN, and the inverted output port OUTb is charged to VDDH. At this time, the N-type transistor N11 is turned on. Since the clock signal CLOCK at the low level is applied to the gate of the N-type transistor N13 in this state, the N-type transistor N13 is turned off (see time periods T5~T6 of FIG. 6).

After that, when the input voltage signal IN is transited from VDDH to GND and then the inverted output port OUTb is completely charged to VDDH, the clock signal CLOCK is changed from the low level to the high level, the N-type transistor N13 is turned on and the inverted output port OUTb is maintained at VDDH so that the N-type transistor N11 is turned on and the node A is accurately re-defined as VSS (see time periods T7~T8 of FIG. 6).

Next, when the input voltage signal IN is transited from GND to VDDH, electric charges are charged in the capacitor C10, the voltage even at the node A is risen by approximately VDDH and is transited to GND (see time period T9 of FIG. 6). Theoretically, the voltage at the node A is transited from VSS to GND and in actuality, the voltage is transited to a voltage which is slightly lower than GND due to peripheral parasitic capacitance etc. At this time, the P-type transistor P10 of the inverter is turned off, the N-type transistor N12 is turned on and the inverted output port is charged to VSS.

In this case, since the clock signal CLOCK at the low level is applied to the gate of the N-type transistor N13, the N-type transistor N13 is turned off (see time periods T9~T10 of FIG. 6). Thus, although, after the input voltage signal IN is transited from GND to VDDH, the inverted output port OUTb is completely charged to VSS, the node A is continuously maintained at the previous voltage GND.

Subsequently, since the clock signal CLOCK is changed from the low level to the high level, the N-type transistor N13 is turned on and the inverted output port OUTb is maintained at VSS, the N-type transistor N11 is turned off and the node A is maintained at the previous voltage GND (see time period T11 of FIG. 6).

Next, when the input voltage signal IN is transited from VDDH to GND (see time period T12 of FIG. 6), electric charges charged in the capacitor C10 are discharged and a voltage even at the node A is fallen by approximately VDDH and is transited from GND to approximately VSS. As such, the N-type transistor N12 is turned off, the P-type transistor P10 is turned on by the input voltage signal IN, and the inverted output port OUTb is charged to VDDH. At this time, the N-type transistor N11 is turned on. Since the clock signal CLOCK at the low level is applied to the gate of the N-type transistor N13 in this state, the N-type transistor N13 is turned off (see time periods T12~T13 of FIG. 6).

After that, when the input voltage signal IN is transited from VDDH to GND and then the inverted output port OUTb is completely charged to VDDH, the clock signal CLOCK is changed from the low level to the high level, the N-type transistor N13 is turned on and the inverted output port OUTb is maintained at VDDH so that the N-type transistor N11 is turned on and the node A is accurately re-defined as VSS (see time periods T14~T15 of FIG. 6).

Subsequently, the node A normally operates in time periods GND~VSS, as illustrated in time periods T9~T15 of FIG. 6 describe above. In this way, a voltage at the node A is accurately re-defined on the condition that the voltage at the node A should be VSS so that the voltage at the node A does not escape from the operating range of VSS~GND intended by an initial voltage or by a parasitic capacitance during capacitive coupling. Thus, the node A of the capacitor C10 that may operate unstably enables the N-type transistor N12 to accurately operate such that an intended stable and low power consumption of operation can be performed.

In other words, when the voltage at the node A is not re-defined in the state where the input voltage signal IN is transited to VDDH, in worst case, that is, when the voltage at the node A is higher or lower than VSS, as subsequent transition of the input voltage signal IN from VDDH to GND and subsequent transition of the input voltage signal IN from GND to VDDH are repeatedly performed, the voltage at the node A gradually escapes from the time periods of GND~VSS and there is the possibility of the occurrence of a problem about operating stability. In addition, when the voltage at the node A escapes from the time periods of GND~VSS in this way, a pass through current is generated between the transistors P10 and N12 and power consumption increases.

Thus, in the present invention, the voltage at the node A is accurately re-defined in every period of the input voltage signal IN so that the voltage at the node A does not escape the time periods of GND~VSS, thereby guaranteeing a stable operation. In addition, a pass through current between the transistors P10 and N12 is not generated and power consumption can be reduced.

Figure 7:
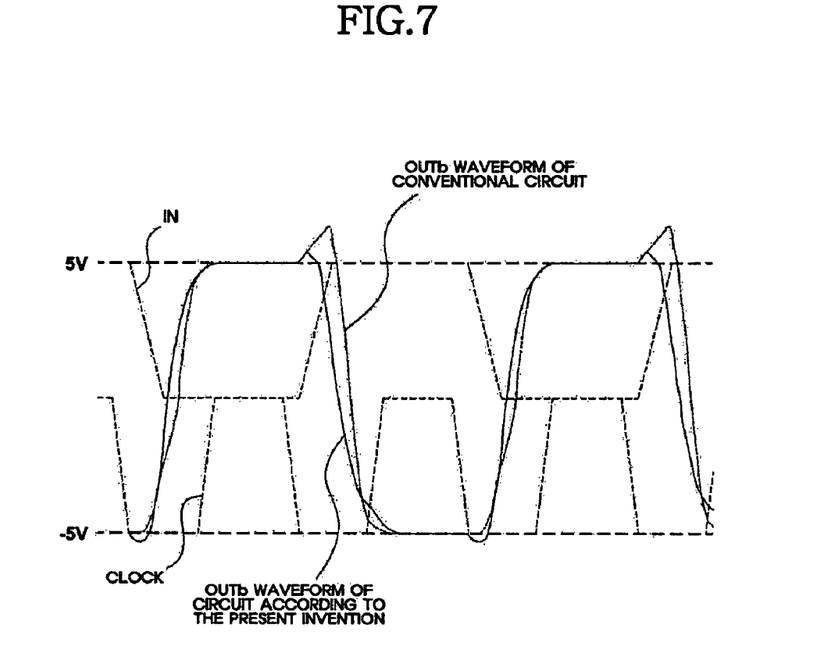
FIG. 7 is a diagram comparing input and output voltage signal waveforms of the level shift circuit according to the present invention with input and output voltage signal waveforms of the conventional level shift circuit.

FIG. 7 is a diagram comparing input and output voltage signal waveforms of the level shift circuit according to the present invention with input and output voltage signal waveforms of the conventional level shift circuit. As illustrated in FIG. 7, propagation delay of the present invention is reduced compared to propagation delay of the conventional level shift circuit.

Figure 8:
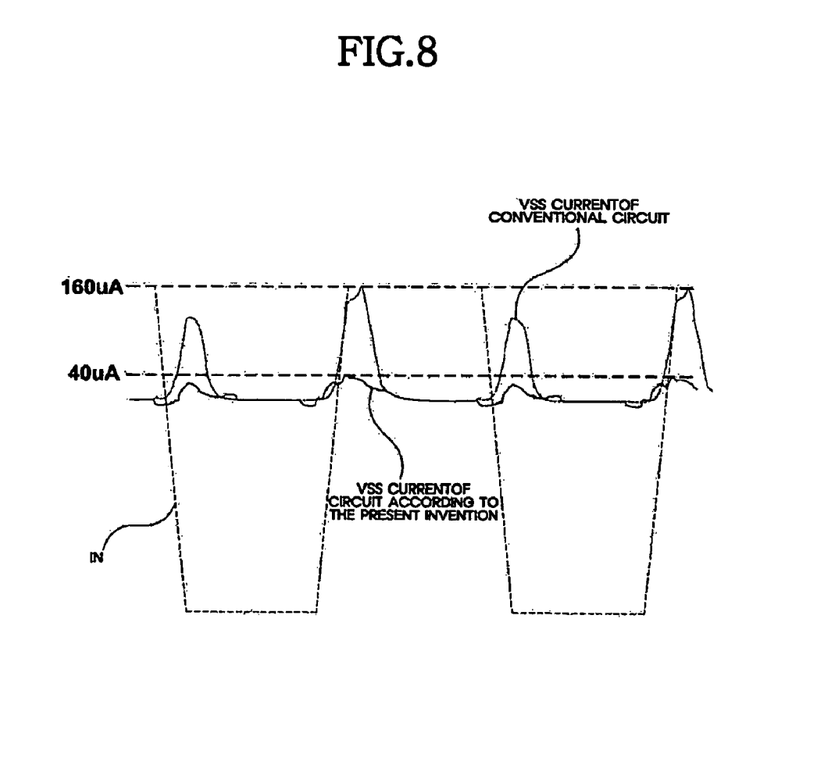
FIG. 8 is a diagram comparing input voltage versus VSS current characteristic of the conventional latch-type level shift circuit illustrated in FIG. 3 with input voltage versus VSS current characteristic of the level shift circuit according to the present invention.

FIG. 8 is a diagram comparing input voltage versus VSS current characteristic of the conventional latch-type level shift circuit illustrated in FIG. 3 with input voltage versus VSS current characteristic of the level shift circuit according to the present invention. A peak current in the level shift circuit according to the present invention is much smaller than a peak current in the conventional latch-type level shift circuit. This means that the pass through current between the transistors P10 and N12 is suppressed and the entire power consumption is remarkably reduced.

As described above, in the level shift circuit using capacitive coupling which is appropriate to a device for driving a flat display according to the present invention, the voltage range at both ends of the capacitor is accurately defined using a feedback signal and a clock signal and a stable capacitive-coupled inverter operation is performed with a comparatively small size such that a level shift circuit of low power consumption, small size and high speed is implemented.

In the above-described specific embodiment, the transistor driven by the input signal IN is used as the P-type transistor and the transistors driven by the signal capacitive-coupled to the input signal IN is used as the N-type transistor. However, in case of up shift, the transistor driven by the input signal IN may be used as the N-type transistor and the transistors driven by the signal capacitive-coupled to the input signal IN may be used as the P-type transistor.

While the present invention has been particularly shown and described with reference to an exemplary embodiment thereof, it will be understood by those of ordinary skill in the art that various changes in form and details may be made therein without departing from the spirit and scope of the present invention as defined by the following claims.

INDUSTRIAL APPLICABILITY

As described above, according to the present invention, the transistor N11 driven by an output voltage which determines whether a target voltage will be charged in the node of the capacitor, and the transistor N13 which prevents the affect of malfunction due to the output voltage that slowly changes during signal transition through a clock signal for defining a transition time period of a signal are connected in series so that one capacitor and three transistors perform an operation that can be performed by two capacitors and four transistors in the conventional level shift circuit using capacitive coupling. Thus, the number of capacitors that take a very large size in the circuit is reduced and the level shift circuit has a large advantage of small size and the advantage of very low power consumption and small peak current compared to the conventional latch-type level shift circuit. In other words, according to the present invention, a stable and high-speed operation can be performed with a comparatively small size and low power consumption can be achieved.

What is claimed is:

1. A level shift circuit comprising:
    an inverter including a first transistor having a first polarity to which an input signal from an input port is applied through a gate and a second transistor having a second polarity which is an opposite polarity to the first polarity, the second transistor being connected in series to the first transistor between a positive source voltage and a negative source voltage and a connection node between the first and second transistors being an output port;
    a capacitor connected between a gate of the first transistor and a gate of the second transistor; and
    a voltage adjusting circuit for accurately adjusting a voltage applied to the gate of the second transistor according to an exact switching operation time of the second transistor, using a clock signal and an output port signal of the inverter.

2. The level shift circuit of claim 1, wherein the voltage adjusting circuit adjusts the voltage applied to the gate of the second transistor after the input signal is fallen and transited, as a predetermined voltage level.

3. The level shift circuit of claim 2, wherein the voltage adjusting circuit comprises:
    a third transistor having a second polarity whose gate is connected to an output port of the inverter and whose source is connected to the negative source voltage; and
    a fourth transistor having a second polarity whose source is connected to a drain of the third transistor and whose drain is connected to a connection node between the capacitor and the second transistor, the clock signal applied to a gate of the fourth transistor, wherein the clock signal has a low level when the input signal is transited and the clock signal has a high level after the input signal is transited.

4. The level shift circuit of claim 3, wherein the first polarity is P-type and the second polarity is N-type, and the predetermined voltage level is a level of the negative source voltage.

5. The level shift circuit of claim 1, further comprising an initial voltage defining unit connected to the gate of the second transistor for defining an initial voltage input to the gate of the second transistor during initial driving.

6. The level shift circuit of claim 5, wherein the initial voltage defining unit is a diode-coupled transistor formed between the gate of the second transistor and a ground.

7. The level shift circuit of claim 4, wherein the first, second, third and fourth transistors are formed on an insulating substrate as a TFT (thin film transistor) using LTPS (low temperature poly-Si).

* * * * *